US006403447B1

(12) United States Patent
Parab

(10) Patent No.: US 6,403,447 B1
(45) Date of Patent: Jun. 11, 2002

(54) REDUCED SUBSTRATE CAPACITANCE HIGH PERFORMANCE SOI PROCESS

(75) Inventor: Sameer Parab, Milpitas, CA (US)

(73) Assignee: Elantec Semiconductor, Inc., Milpitas, CA (US)

( * ) Notice: Subject to any disclaimer, the term of this patent is extended or adjusted under 35 U.S.C. 154(b) by 0 days.

(21) Appl. No.: 09/348,782

(22) Filed: Jul. 7, 1999

(51) Int. Cl.$^7$ .......................... H01L 21/30; H01L 21/46
(52) U.S. Cl. ...................... 438/459; 438/455; 438/408; 438/967; 438/977
(58) Field of Search ................... 438/455, 459, 438/406, 977, 967

(56) References Cited

U.S. PATENT DOCUMENTS

| | | | |
|---|---|---|---|
| 4,638,552 A | | 1/1987 | Shimbo et al. |
| 4,968,628 A | | 11/1990 | Delgado et al. |
| 5,034,343 A | * | 7/1991 | Rouse et al. ................. 437/86 |
| 5,240,876 A | * | 8/1993 | Gaul et al. ................. 437/131 |
| 5,459,104 A | | 10/1995 | Sakai |
| 5,484,738 A | | 1/1996 | Chu et al. |
| 5,755,914 A | | 5/1998 | Yonehara |

OTHER PUBLICATIONS

U.S. application No. 09/294,564, Parab, filed Apr. 20, 1999.
Maszara, W.P., "SOI By Wafer Bonding: A Review," ECS: SOI Technology and Devices, vol. 90–6, 1990, p. 190–212B.

Abe, T., et al., "Silicon Wafer–Bonding Process Technology For SOI Structures," ECS: SOI Technology and Devices, vol. 90–6, 1990.

Beitman, B.A., et al., "Bonded SOI In A Bipolar IC Without Trench Isolation," ECS: Semiconductor Wafer Bonding, vol. 93–29, 1993.

Abe, T., et al., "Bonded SOI Wafers With Various Substrates For IC Fabrication," ECS: Semiconductor Wafer Bonding, vol. 93–29, 1993.

Saul, P., "The benefits of bonding silicon on insulator for bipolar ICs," (Publication identity unknown).

* cited by examiner

Primary Examiner—John F. Niebling
Assistant Examiner—David A Zarneke
(74) Attorney, Agent, or Firm—Fliesler, Dubb, Meyer & Lovejoy, LLP

(57) ABSTRACT

A method for forming a semiconductor substrate is provided including the general sequential steps of: providing a handle wafer and a device wafer; implanting at least a first impurity region in a first surface of the device wafer; bonding the first surface of the device wafer to a first surface of the handle wafer having a silicon dioxide layer; removing a portion of the device wafer at a second surface; and forming an epitaxial silicon layer on the second surface of the device wafer. The process enables the thickness of the device wafer to be minimal.

16 Claims, 5 Drawing Sheets

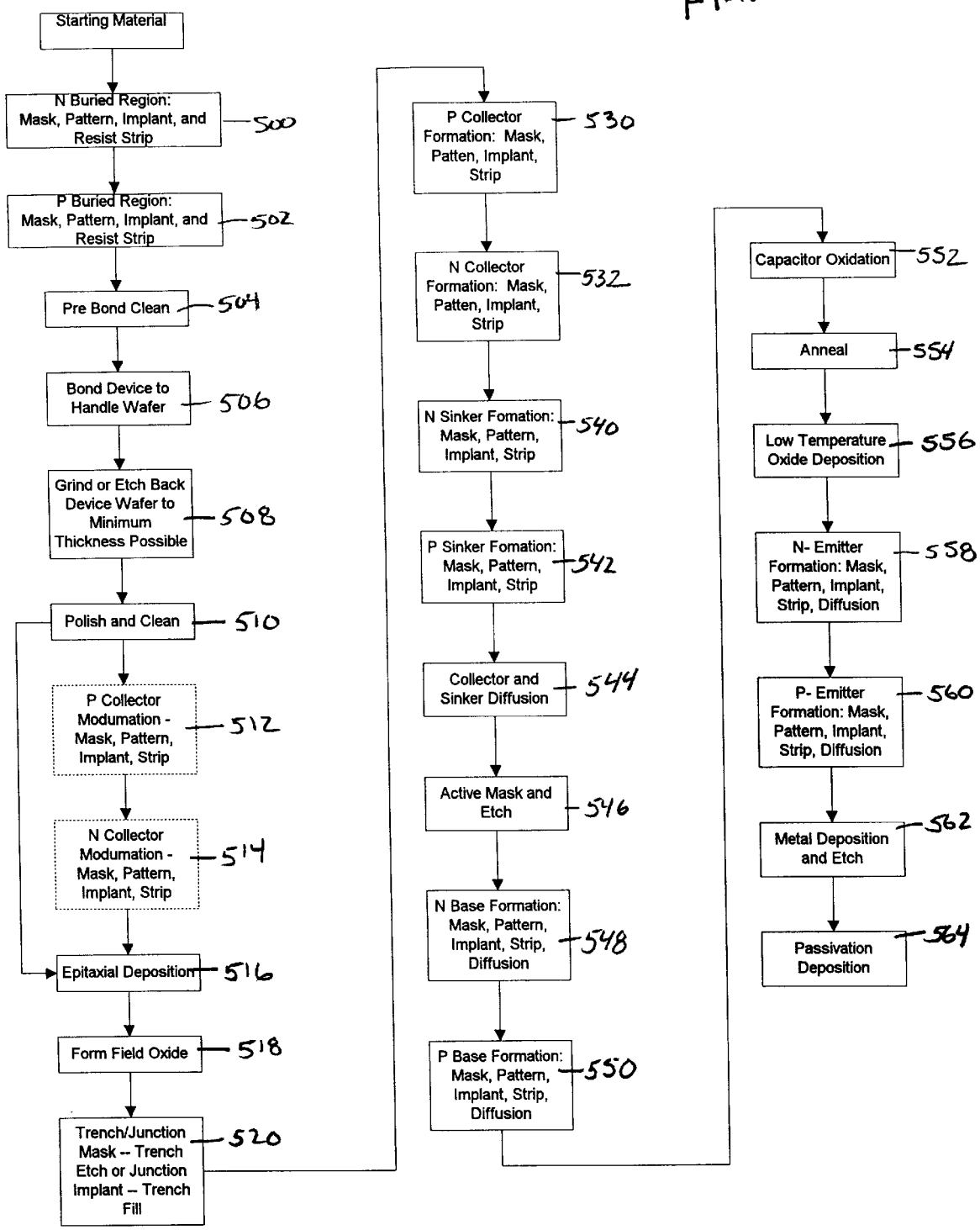

REDUCED SUBSTRATE CAPACITANCE HIGH PERFORMANCE SOI PROCESS

BACKGROUND OF THE INVENTION

1. Field of the Invention

The invention relates to a silicon-on-insulator (SOI) structure, a method for forming silicon-on-insulator substrates, and devices formed in such substrates. In particular, the invention concerns bipolar devices formed in an improved SOI substrate, and a method for forming a bipolar device in a silicon-on-insulator substrate.

2. Description of the Related Art

Integrated circuit devices generally comprise a number of active devices formed on and in a semiconductor substrate, which are coupled by at least one layer of conducting material, such as polysilicon or metal. In manufacturing integrated circuits, while bulk silicon wafer(s) are commonly used, a number of advantages accompany the use of silicon-on-insulator substrates. In general, a silicon-on-insulator substrate comprises a layer of device silicon overlying a layer of insulating material. SOI substrates provide the advantages of increased packing densities and low parasitic capacitances in certain types of devices manufactured on such substrates. In bipolar devices, construction on silicon-on-insulator substrates provides a number of distinct advantages.

One technique for constructing silicon-on-insulator substrates is to bond two bulk silicon substrates to each other; a so-called "device" substrate is bonded to a so-called "handle" or "bonding" substrate by any number of techniques. Normally, bonding is done using blank unprocessed silicon device wafers on oxidized silicon handle wafers. This method has achieved wide acceptance in the industry due to its simplicity, robustness and high yield. Once the device wafer is bonded to the handle wafer, a device wafer is generally etched or polished back to obtain a desired thickness for the wafer. Further polishing and cleaning generates a quality silicon-on-insulator wafer for device fabrication.

One disadvantage of this method is that the cost of the starting material bonded wafers is relatively high.

In forming bipolar devices, it is advantageous to provide buried layers of an impurity at the bottom surface of the substrate in order to reduce the resistance of collector bulk regions. In many current SOI processes, to provide the buried layers, after a bonded wafer is constructed, a field oxide is grown or deposited on the wafer. This oxide is then patterned using photolithography and high dose implants of an N-type or P-type conductivity, as the case may be, are implanted to define the N-type or P-type buried layers. The implantation is of sufficient force to place the buried layers below the surface of the device wafer substrate at a desired depth and concentration so that subsequent processing will result in migration of the impurity to its desired location in the substrate through diffusion. This method requires expensive equipment for high energy implants and thinner device layer SOI wafers. Both factors tend to increase cost. Alternatively, the implants will be made into the surface of the device wafer following bonding, and an epitaxial layer is then formed on the surface of the device (following removal of the resist pattern and oxide). During epitaxial deposition, the implanted buried layers are subject to thermal forces that diffuse these layers in all directions.

The resulting structure is shown in FIG. 1. In FIG. 1, a handle substrate 10 is coupled to a device substrate 20 by an oxide layer 30. Device substrate 20 has been ground or etched back from its original thickness to a thickness dT of about 2 μm. An epitaxial layer 40 is shown on the upper surface 25 of device substrate 20. An N+ buried region 50 and a P+ upper buried region 55 are shown as being present below the surface 60 of silicon-on-insulator substrate 100. As shown in FIG. 1, buried layers diffuse both upward into the epitaxial layer and downward into the device wafer 20. These buried layers will define collector regions of a complementary bipolar silicon-on-insulator device.

After formation of the buried regions 50,55, the SOI substrate has a parasitic substrate capacitance that varies as a function of the depth of the substrate. In FIG. 2, the left side of the horizontal scale indicates the dopant concentration levels for a typical bipolar transistor and the variation of concentrations and junctions through epilayer and device wafer down toward the silicon dioxide 30, at the right side of the horizontal scale. As shown therein, in the substrate of the prior art, the buried layer concentration profile peaks at the juncture between the epitaxial layer and the remaining portion of the device wafer.

The presence of buried layers at the interface of the epitaxial layer and the handle wafer 20 creates a large diffused buried layer. This increases the total tub depth thickness to T+dT, where dT is the thickness of the remaining portion of the device wafer. Typically, this thickness is about 2 μm. This additional 2 μm contributes to higher substrate capacitances, saturation voltages, and lowers the speed of devices formed in such substrates. Effectively, bipolar transistors formed in such i substrates have compromised performance due to the presence of buried layers at the top of the device wafer 20. In addition, that portion of the handle wafer 20 below the concentration peak having a thickness dT is wasted in the SOI substrate.

SUMMARY OF THE INVENTION

The invention, roughly described, comprises in one aspect a method for forming a semiconductor substrate. The method comprises the general steps of: providing a handle wafer and a device wafer; implanting at least a first impurity region in a first surface of the device wafer; bonding the first surface of the device wafer to a first surface of the handle wafer with a silicon dioxide layer; removing a portion of the device wafer at the second surface; and forming an epitaxial silicon layer on the second surface of the device wafer.

One or more impurity regions may be implanted into the device wafer utilizing both N and P type impurities. The bonding step may comprise the substeps of forming a bonding oxide on the surface of the handle wafer; coupling the first surface to the bonding oxide; and heating the handle wafer and the device wafer.

In a unique aspect, said step of removing a portion of the device wafer comprises removing a portion of the device layer such that the remaining portion of the device layer has a minimum thickness possible with the technique used for removing.

In a further aspect, the invention comprises a silicon on insulator substrate. The substrate comprises a handle wafer; a layer of bonding material; a device wafer, the device wafer including at least one buried impurity region extending from said layer of bonding material upward into said device wafer; and an epitaxial silicon layer provided on a second surface of the device wafer. In a unique aspect, the thickness of the device wafer is defined by the minimum possible thickness utilized by the process to form said device wafer.

BRIEF DESCRIPTION OF THE DRAWINGS

The invention will be described with respect to the particular embodiments thereof. Other objects, features, and advantages of the invention will become apparent with reference to the specification and drawings in which:

FIG. 12 is a flow chart of the method of the invention.

DETAILED DESCRIPTION OF THE PREFERRED EMBODIMENTS

Described below are a method for forming a silicon-on-insulator substrate, a method for forming a bipolar transistor structure, and a bipolar transistor structure formed on a silicon-on-insulator substrate in accordance with the present invention. Significant gains in device performance are achieved in the device of the present invention as buried layers are fabricated at the bottom of the device layer in a silicon-on-insulator substrate. With buried layers present at the bottom of the device layer, the effective device tub depth is smaller than that shown with respect to the prior art. In the method of the present invention, buried layers only diffuse upward, as they are initially positioned to encounter the bonding oxide which prevents a downward diffusion path of the buried layer.

Hence, the method of the present invention results in a small yet highly conductive buried layer profile complemented, with a reduction in tub depth thickness. In one aspect, this reduction in tub depth is the same as the thickness of the silicon-on-insulator layer or about 2 $\mu$m. Since the tub depth is smaller than conventional processes by about 2 $\mu$m, superior device characteristics are realized in terms of reduced substrate capacitance, lower saturation voltages, and higher speeds on both the device and circuit levels.

The method of the invention is illustrated in flow chart form in FIG. 12 and throughout the specification, reference will be made to the steps illustrated therein.

Figure 1:
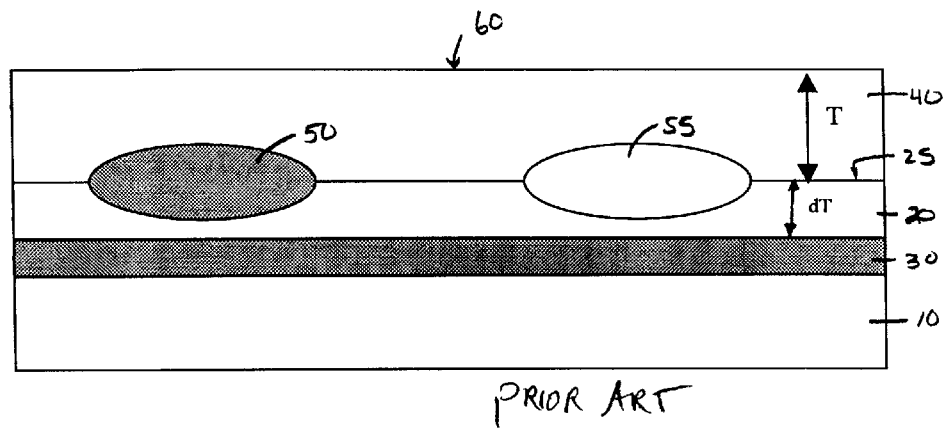
FIG. 1 is a cross-section of a silicon-on-insulator substrate having buried regions formed in accordance with the method of the prior art.
Figure 3:
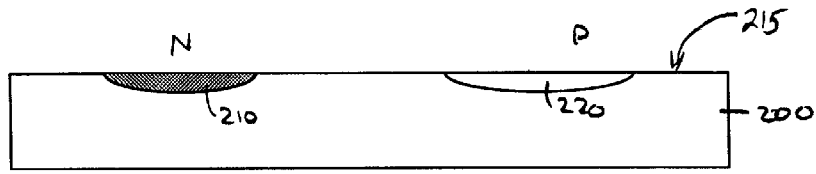
FIGS. 3–6 are cross-sections of the formation of a silicon-on-insulator substrate in accordance with the method of the present invention.

FIGS. 3–11 illustrate cross-sections of a device under formation in accordance with the present invention. Shown in FIG. 3 is a semiconductor substrate 200, which may comprise a bulk silicon substrate having a background doping concentration of an N-type or P-type impurity, and having a crystal lattice structure of 1-0-0. Substrate 200 will eventually form the device substrate in the SOI substrate portion of the invention. For purposes of the description of the invention, in one embodiment, substrate 200 has a P-type background doping concentration of $10^{16}$ atm/cm$^{-3}$.

Initially, the N and P buried regions are formed in substrate 200 (steps 500 and 502 in FIG. 12). In order to form an N-type buried region 210 (step 500), a masking layer (not shown) is formed on the surface 215 of substrate 200 and patterned to open a window (hot shown) over the area of surface 215 where region 210 is to be formed. The mask layer may be a photoresist layer of any known type, or may be any of a number of alternative masking layers such as, for example, silicon dioxide or silicon nitride. In either case, the mask layers are formed and patterned in accordance with well-known techniques for such layers.

An implant of an N-type impurity such as arsenic or phosphorous is then made into substrate 200 at an energy in the range of about 25 to 180 KeV to provide a resulting concentration of about $10^{17}$ to $10^{21}$ atm-cm$^{-3}$ forming region 210.

Subsequently, the N region masking layer is removed and a P-type buried region is formed (step 502). A second mask layer (not shown) is first formed and again may be any of the type mentioned above, formed and patterned in accordance with well-known techniques in order to open a window (not shown) in the mask layer. An implant at an energy of 25 to 180 of a P-type impurity such as boron forms region 220 with a concentration of about $10^{17}$–$10^{21}$ atm/cm$^{-3}$ in substrate 215. Subsequently, the P-type buried region mask is stripped, and substrate 200 with regions 210 and 220 formed therein will undergo a pre-bond cleaning (step 504). The resulting structure is shown in FIG. 3.

In one aspect, the cleaning process of step 504 proceeds first with a chemical cleaning of the wafers, followed by a megasonic cleaning of the wafers, and finally drying of the wafers utilizing one of a number of commercial drying apparatus which performs marangoni drying. The cleaning and drying process may, in one embodiment, be followed by a high temperature anneal to cure silicon damage caused by the implants used for regions 210,220, as discussed in co-pending application Ser. No. 09/294,564 entitled SILICON TO OXIDE WAFER BONDING PROCESS, Inventor Sameer Parab, filed Apr. 20, 1999, assigned to the Assignee of the present application.

Figure 4:
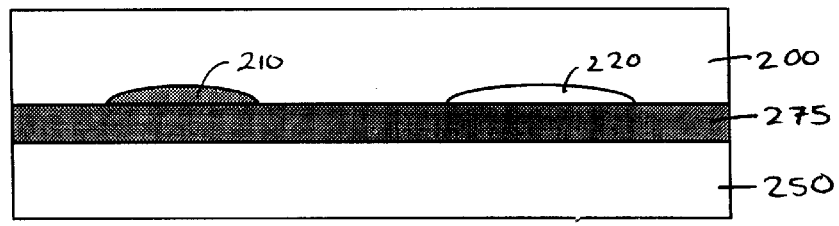

As shown in FIG. 4, substrate 200 is thereafter bonded (step 506) to a handle wafer 250. As shown in FIG. 4, in this embodiment of the invention, a bonding oxide 275 is used at the interface of device wafer 200 and handle wafer 250. However, the procedure for bonding the device wafer 200 to handle wafer 250 may be any of a number of bonding techniques such as those described in *Mazzera*, "SOI By Wafer Bonding: A Review," ECS: SOI Technology and Devices, Volume 90–6, 1990.

Generally, bonding oxide 275 is formed on handle wafer 250 prior to bonding by a thermal oxidation or deposition oxidation process resulting in oxide 275 having a thickness of about 0.5 $\mu$m to 2 $\mu$m, and bonding occurs through surface coupling and annealing of the bonded wafer shown in FIG. 4 at a temperature of 300°–1100° C. for a period of one to ten hours to ensure adequate bonding strength between the handle wafer 200 and the device wafer 250. It should be recognized these parameters may change based on oxide thickness and other factors.

Figure 5:
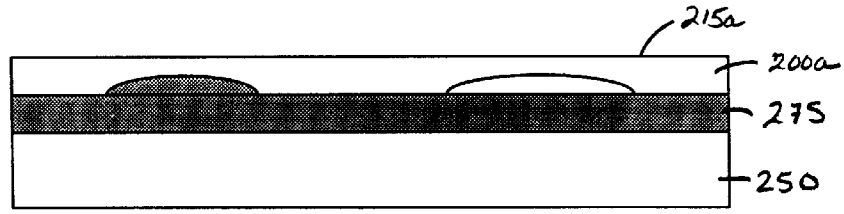
Figure 2:
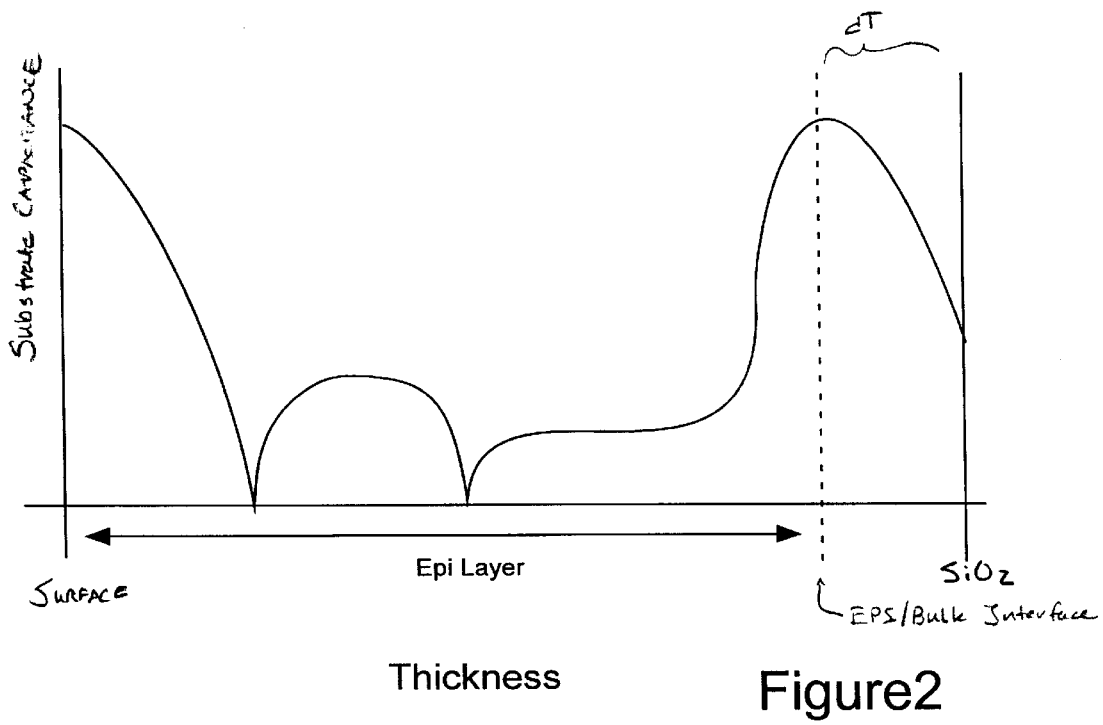
FIG. 2 is a graph representing concentration levels as a function of depth for the structure shown in FIG. 1.

Following bonding, at step 508 the device wafer 200 is ground or etched to form a thinner device wafer 200a as shown in FIG. 5. Current commercial grinding techniques are accurate only to about +/–0.5 $\mu$m surface smoothness tolerance. Hence, in accordance with the invention, layer 200a is ground back to a minimum thickness possible in accordance with the grinding tool being used, or the etch process which is utilized, to thin the device wafer 200. For a grinding process with an accuracy of 0.5 $\mu$m, this thickness is about 2.0 $\mu$m. The method provides particular advantages when used with commercial grinding and polishing processes, which are lower-cost than more accurate etching processes. It should be recognized that the thicknesses set forth herein are exemplary, as is the accuracy of the grinding process, and the actual values will vary according to the thinning process being utilized. For purposes of the invention, it is only critical that some portion of the device layer containing regions 210 and 220 remain following the process used to thin the wafer 200. Hence, future grinding processes more accurate than the 0.5 μm current technology may be utilized in accordance with the present invention, as may etch back processes, and hence dT may be thinner than 2 μm. The resulting ground layer 200a is shown in FIG. 5.

Following thinning, the device wafer is polished and cleaned (step 510) to ensure as smooth a surface as possible for subsequent epitaxial layer deposition.

Optionally, at this point of the process, a P collector and N collector modulation implant, utilized in the construction of bipolar devices, may be performed to ensure proper migration of the buried region and correct collector profiles. The N and P modulation implant regions (not shown) will be formed on to the buried regions 210,220, respectively, in accordance with well-known techniques. For example, an N-type collector implant modulation mask (step 512) will be formed in accordance with the foregoing descriptions to allow an N-type impurity implant at an energy of about 25 KeV to 180 KeV having a concentration of $10^{15}-10^{17}$ to be made adjacent to or superimposed on the N region 210. Similarly, at step 524 a P collector modulation mask and implant may be utilized with respect to region 220. The modulation implants form regions which are generally located above regions 210 and 220 in order to ensure correct concentrations between the buried regions 210,220 and the collector which will be subsequently formed in the transistor structure.

Figure 6:
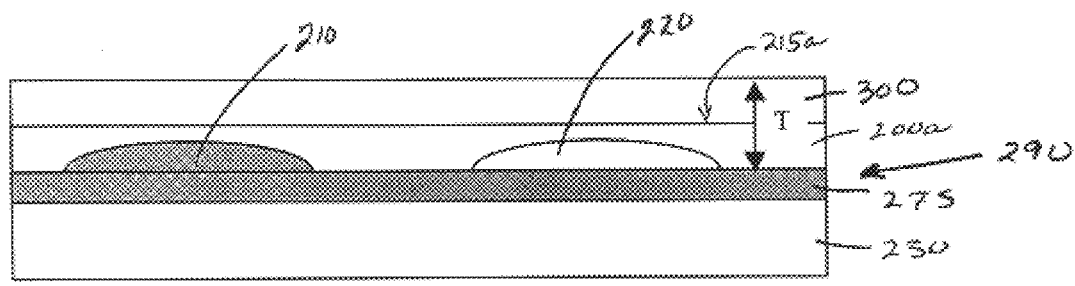

Next, as shown in FIG. 12 at step 516 and in cross-section at FIG. 6, an epitaxial silicon layer 300 is formed on the surface 215a of device wafer 200a. Epitaxial silicon layer 300 may be formed to a desired thickness by placing substrate 290 in a silane or silicon chloride atmosphere at a temperature in the range of 300°–1,200° C. in accordance with conventional techniques. Alternatively, molecular beam epitaxy may be used to deposit the epitaxial layer at a pressure of about $10^{-9}$ to $10^{-11}$ Torr and a temperature in a range of 450°–750° C. In either case, lower temperature processes are desirable to reduce any diffusion of regions 210 and 220.

During epitaxial layer deposition some diffusion of regions 210 and 220 will occur due to the heating of the substrate which occurs during this process. Diffusion of regions 210,220 will occur in accordance with well-known diffusion properties of the particular impurity used for the implant. FIG. 6 illustrates one case of such diffusion wherein regions 210 and 220 are formed in device layer 200a and remain solely within layer 200a. It should be recognized that buried regions 210,220 may migrate into epitaxial layer 300 in cases where device layer 200a has been thinned to a sufficient level that diffusion of regions 210 and 220 will allow such migration.

Figure 7:
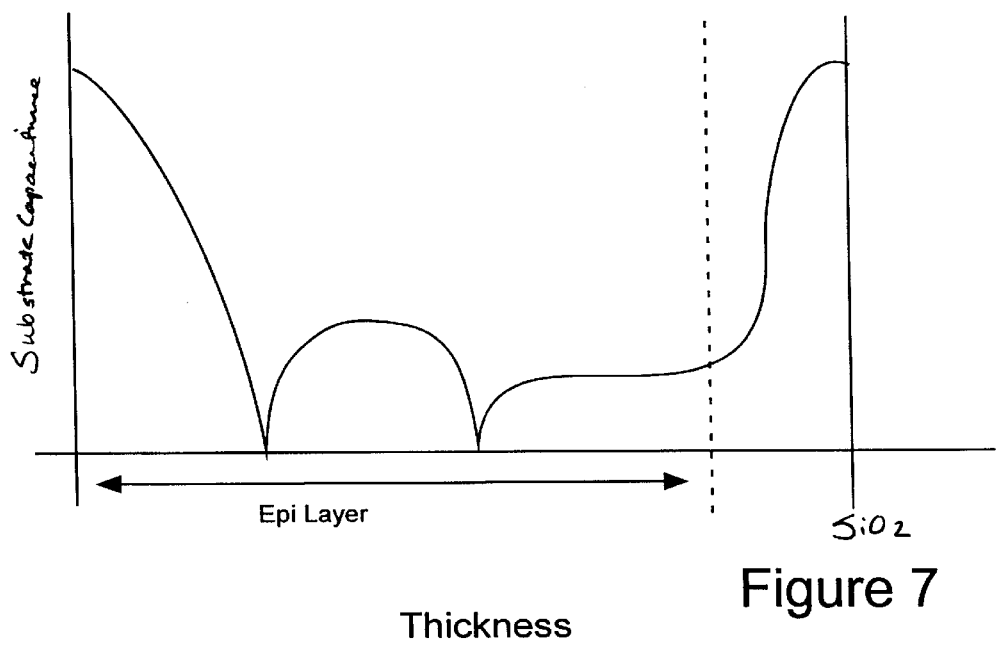
FIG. 7 is a graph representing the concentration level as a function of depth for the substrate of the present invention.

The resulting structure 290 shown in FIG. 6 is a silicon-on-insulator substrate with buried impurity regions having an improved substrate capacitance profile over that of the prior art. Shown in FIG. 7 is the concentration profile of the substrate shown in FIG. 6. As shown therein, the substrate of the present invention is thinner than the prior art SOI substrate by a thickness of dT; the material which formerly comprised thickness dT in the device wafer 20 of the prior art is no longer present in this device. The resulting device tub region has a thickness T. In accordance with the present invention, this reduced thickness reduces the substrate capacitance and saturation voltages when buried layers or high conductivity regions are present at the bottom of the silicon insulator layer.

Following formation of the substrate 290 as shown in FIG. 6, a complementary bipolar transistor structure may be formed in accordance with a further aspect of the invention as shown in FIGS. 8–11.

Initially, at step 520 (FIG. 12), field oxide layer 310 (shown in FIG. 8) is formed over the surface of epitaxial layer 300. Field oxide 310 may be a CVD deposited oxide layer or a thermally-grown oxide layer formed in accordance with well-known techniques.

Subsequently, active device areas, where active components are to be formed in the substrate, are isolated by one of several methods of active area isolation (step 520). In one well-known embodiment, trench isolation may be utilized. There are a number of well-known processes for fabricating trench isolation. In one method, a trench is etched in epitaxial layer 300 and device layer 200a, and the trench filled with an isolation material. The trench is formed by deposition of a marking layer followed by patterning of the trench mask and a trench etch using a directional dry etch technique such as reactive ion etching of epitaxial layer 300 and device wafer 200a. The trench etch is followed by a trench fill of, for example, a layer of deposited oxide followed by a thicker, highly-doped polysilicon layer. The trench fill may be followed by subsequent thermal processing. Trench isolation is shown in block form at reference numeral 320 in FIG. 8A.

Figure 8A:
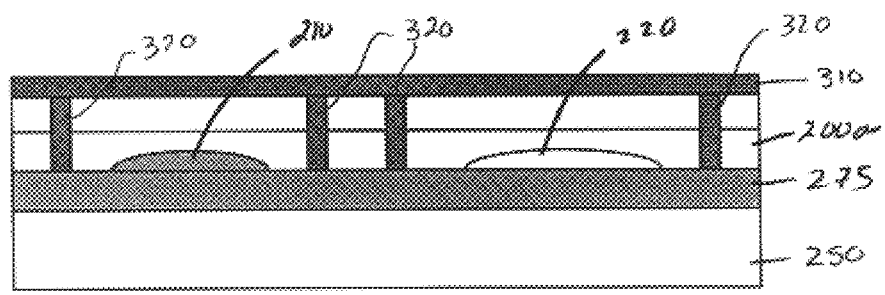
FIGS. 8–11 are cross-sections of a silicon-on-insulator substrate illustrating the construction of complementary bipolar transistors in the silicon-on-insulator substrate.
Figure 8B:
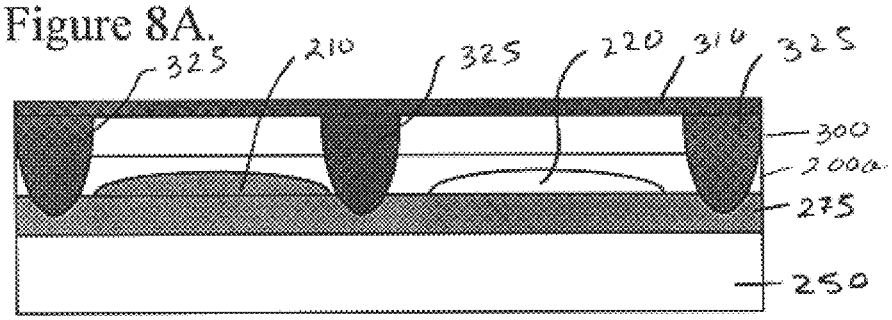

An alternative method of isolating is shown in FIG. 8B. Junction isolation region 325 is formed through the use of a masking layer such as a photoresist layer patterned in accordance with well-known techniques to open windows in the layer to allow a junction implant and diffusant of a P or N conductivity type (opposite to the tub in which the device is formed) deep into both epitaxial layer 300 and device layer 200a.

Next, the N-type and P-type collectors are formed (steps 530 and 532) by utilizing a series of masking, patterning, and implant (and/or diffusion) steps. The N-type and P-type collectors 311,312 are illustrated as shaded diffusions in FIG. 9. It will be understood by one of average skill in the art that their formation is required for proper operation of a bipolar transistor. An exemplary P-type collector implant will be performed at an energy of about 25 to 180 KeV to form a collector region having a doping concentration of about $10^{15}-10^{17}$ atm/cm$^{-3}$.

Figure 9:
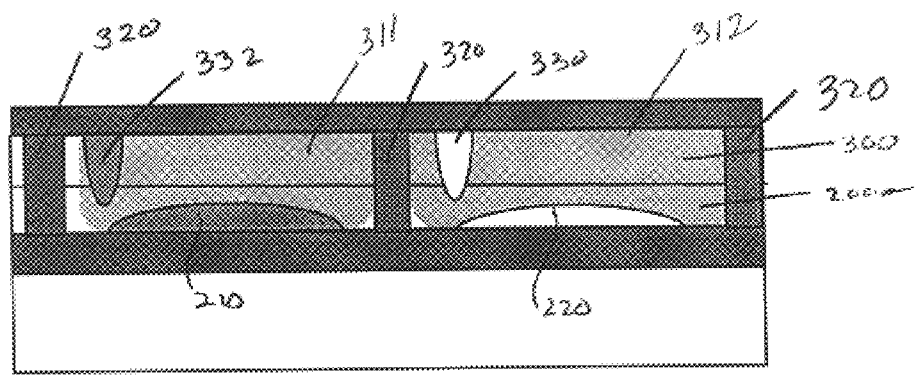

Next, at steps 540 and 542, N-type and P-type sinkers 330,332 are formed in the structure 290 as shown in FIG. 9. Once again, a series of masking and implant steps are used to form the sinker regions 330,332. Again, any of a number of types of photoresist, silicon dioxide, or silicon nitride masks are deposited and patterned in accordance with conventional methods for the resist layer, and an impurity implant at an energy of 25 to 180 KeV to form N sinker region 330 with an arsenic or phosphorous concentration of $10^{17}-10^{21}$ cm$^{-3}$, and 25 to 180 KeV to form P sinker region 332 with a boron concentration of $10^{17}-10^{21}$ cm$^{-3}$ are used.

Figure 10:
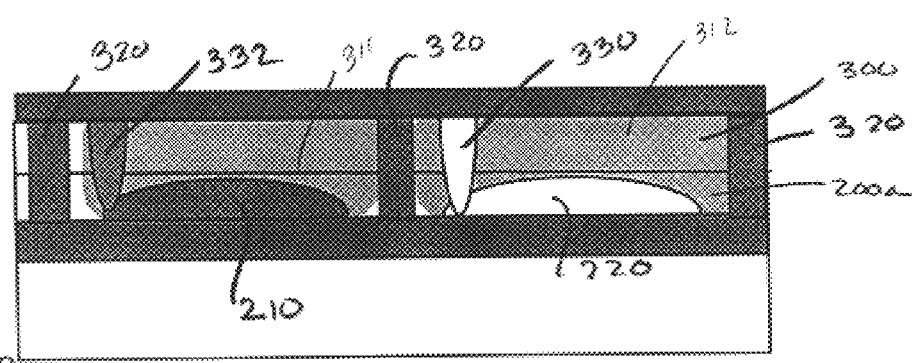

A drive-in diffusion at step 544 follows the sinker implant to correctly position the sinker and collectors. The resulting structure is shown in FIG. 10. This diffusion step may comprise heating the substrate at a temperature of 1000–1250° or for an adequate period of time. The drive-in step for the collectors and sinkers has the side effect that the buried regions 210,220 will diffuse upward further into the substrate 290. In FIG. 10, the buried regions are shown as contact in the junction between the epitaxial layer and the device substrate. As noted above, it will be recognized that the diffusion of the buried regions may, in some embodiments, proceed through this junction into the epitaxial layer or may not reach this junction, depending on the device being formed.

As noted above, the method of the present invention is illustrated in flow chart form in FIG. 12. To avoid unnecessary replication of similar cross-sectional figures, each masking, etching, implant and diffusion step is not shown in cross-section. However, application of each step in FIG. 12 will be readily apparent to one of average skill in the art in view of the foregoing.

Next, at step 546 an active region for the complementary transistor will be formed in the substrate. If, for example, the device wafer 200*a* and epitaxial layer 300 are formed having a P-type background doping concentration, an N-type implant will be utilized to form the complementary transistor. Once again, a series of masking and etching steps is utilized. First, an active mask layer will be provided over the substrate and the mask patterned to form a window above the active area to be implanted.

Subsequently, at steps 548,550, the respective base regions 350,352 for the bipolar transistors will be formed. First an N-base mask will be formed and patterned, and an N-type implant provided into area 350 where the. N-type base is formed. This implant is typically of phosphorous at an energy of 120 KeV to a depth of about 1.5 $\mu$m, and at a concentration of $10^{18}$ atm/cm$^{-3}$. Next, a diffusion step is used to drive the dopant into the structure 290 to complete the N-type base.

Next, a P-base region 352 is formed through a mask, an implant and diffusion in a manner equivalent to the N-base region formation. The P-type implant is typically boron at an energy of about 80 KeV to a depth of about 1.7 $\mu$m, and at a concentration of $10^{17}$ atm/cm$^{-3}$.

Next, at step 552 a capacitor oxide formation is performed. The capacitor oxide is used to form a semiconductor based capacitor element in the substrate which may comprise a component of integrated circuit of which the complementary bipolar structure shown in FIGS. 1–12 is a part, in a different portion of the substrate (not shown). This capacitor oxide formation may take place by any of a number of well-known methods, including thermal oxidation of selectively exposed silicon regions. Capacitor oxide formation is followed by an annealing at step 554.

Figure 11:
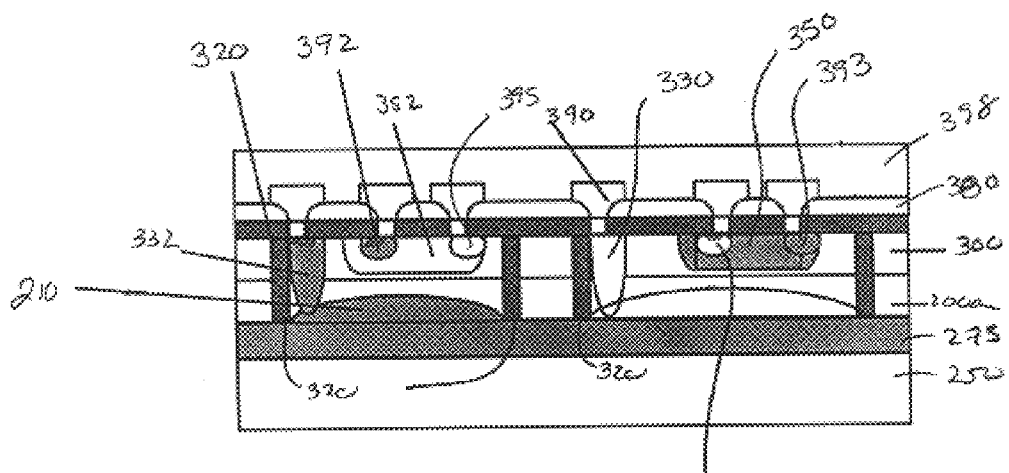

Following this annealing step, a low temperature oxide deposition at step 556 is performed over the epitaxial layer surface to form an oxide as shown in FIG. 11 (after patterning) at reference numeral 380.

Following deposition of the low temperature oxide 380, the N- and P-type emitters 392,394 for the respective transistors are formed at step 558,560. Once again, for each emitter formation, a masking layer is formed and patterned in accordance with well-known techniques. An implant is made into the surface of the epitaxial layer, and a diffusion step performed to place the emitter impurity region in the correct location within the active region 375. Optionally additional base implants 393,395 may be provided in regions 350,352, respectively.

Finally, at step 562 metal contacts 390 are deposited and formed to interconnect regions of the complementary bipolar transistor with other components of the integrated circuit as shown in FIG. 11. The metal deposit layer is etched following deposition in accordance with well-known techniques to form contacts 390 as shown in FIG. 11. Finally, a passivation layer 398 covering the metal etch contacts is deposited at step 564.

The method and structure of the present invention provides varied N- and P-type buried layers for bipolar device formation at the bottom of a silicon-on-insulator layer. The method provides a means of introducing high conductivity regions of N- and P-types into the bottom of the silicon-on-insulator layer. The total tub thickness of the final device is reduced by introducing the buried layers prior to bonding. One or both types of impurity regions can be provided. As a result, the substrate capacitance due to reduced tub thickness and the introduced buried layers provides an improved bipolar device. In addition, the device has increased operational speed. A direct silicon to silicon dioxide bond is utilized.

In addition, collector layer modulation after silicon to silicon dioxide bonding and prior to epitaxial silicon deposition is a benefit of the present invention. Additional implants to grade the buried region prior to epitaxial deposition helps to achieve lower saturation voltages for the bipolar transistors formed in accordance with this method. The method of the invention allows for trench isolation or N- or P-type junction isolation depending on the nature of the device under construction. Silicon etch trenches of any shape and size may be utilized. In addition, the trenches may be refilled with combinations of silicon dioxide, silicon nitride and high conductivity polysilicon of N- or P-type conductivity.

These and other advantages of the present invention will be readily apparent to one of average skill in the art. The invention provides particular advantages of a low-cost method to provide thin, low capacitance SOI substrates by allowing low-cost processes, such as grinding, to be used to thin device wafers. All such features and advantages are intended to be within the scope of the invention as set forth herein and as defined by the following claims.

What is claimed is:

1. A process for manufacturing a substrate having low substrate capacitance and lower saturation voltages with buried impurity regions, comprising the steps of:
   providing a handle wafer having a first and a second surface;
   providing a device wafer having a first and a second surface;
   sequentially:
   (A) forming implant regions in the first surface of the device wafer;
   (B) forming a bonding oxide layer on the first surface of the handle wafer;
   (C) coupling the first surface of the device wafer to the bonding layer;
   (D) removing portions of the device wafer from the second surface of the device wafer; and
   (E) forming an epitaxial silicon layer on the second surface of the device wafer.

2. The method of claim 1 wherein said step (A) comprises implanting an n-type impurity to a junction depth of less than 1 micron.

3. The method of claim 1 wherein said step (A) comprises implanting an p-type impurity at a junction depth of less than 1 micron.

4. The method of claim 1 wherein said step (D) comprises grinding the device layer.

5. The method of claim 1 wherein said step (D) comprises etching the device layer.

6. The method of claim 1 wherein said step (a) comprises implanting an n-type impurity at an energy of 25–180 KeV to a concentration of about $10^{17}$–$10^{21}$ atm/cm$^{-3}$.

7. The method of claim 1 wherein said step (a) comprises implanting an p-type impurity at an energy of 25–180 KeV to a junction depth of about $10^{17}$–$10^{21}$ atm/cm$^{-3}$.

8. The method of claim 1 wherein said step (c) comprises:
coupling the first surface to the bonding oxide; and
heating the handle wafer and the device wafer.

9. The method of claim 8 wherein said step of forming a bonding oxide comprises forming an oxide having a thickness in the range of 0.5 $\mu$m to 2.0 $\mu$m.

10. The method of claim 1 wherein said step (d) comprises removing a portion of the device layer such that the remaining portion of the device layer has a minimum thickness possible with the technique used for removing.

11. The method of claim 1 wherein said step (d) comprises grinding and polishing the device layer.

12. The method of claim 1 wherein said step (d) includes removing a portion of said at least one of the implant regions during said removing step.

13. The method of claim 1 wherein said step (e) comprises growing a layer of silicon in a silane containing atmosphere.

14. The method of claim 13 wherein said step (e) includes diffusing a portion of said at least one of the implant regions into said epitaxial layer.

15. The method of claim 1 wherein said step (d) results in a remaining portion of the device wafer having a thickness of about 1–2 microns.

16. The method of claim 15 wherein said step (E) comprises forming said epitaxial layer with an upper surface such that the distance between the upper surface of the epitaxial layer and the bonding oxide is about 4–5 microns.

* * * * *